United States Patent
Soerensen et al.

(10) Patent No.: US 6,889,331 B2
(45) Date of Patent: May 3, 2005

(54) DYNAMIC VOLTAGE CONTROL METHOD AND APPARATUS

(75) Inventors: Joern Soerensen, Aars (DK); Michael Allen, Austin, TX (US); Palle Birk, Gistrup (DK)

(73) Assignee: Analog Devices, Inc., Norwood, MA (US)

( * ) Notice: Subject to any disclaimer, the term of this patent is extended or adjusted under 35 U.S.C. 154(b) by 237 days.

(21) Appl. No.: 10/231,446

(22) Filed: Aug. 29, 2002

(65) Prior Publication Data

US 2003/0071657 A1 Apr. 17, 2003

Related U.S. Application Data

(60) Provisional application No. 60/315,655, filed on Aug. 29, 2001.

(51) Int. Cl.[7] .............................. G06F 1/32; G06F 1/08
(52) U.S. Cl. ....................... 713/320; 713/322; 713/501; 327/156; 327/159
(58) Field of Search .................................... 713/322, 500, 713/501, 600, 601, 320; 327/156, 159

(56) References Cited

U.S. PATENT DOCUMENTS

| | | | |
|---|---|---|---|
| 5,606,293 A | 2/1997 | Matsui et al. | |
| 5,623,234 A | 4/1997 | Shaik et al. | |
| 5,774,701 A | 6/1998 | Matsui et al. | |
| 6,005,904 A | 12/1999 | Knapp et al. | |
| 6,118,306 A | 9/2000 | Orton et al. | |
| 6,425,086 B1 * | 7/2002 | Clark et al. | 713/322 |
| 6,625,740 B1 * | 9/2003 | Datar et al. | 713/324 |

FOREIGN PATENT DOCUMENTS

| | | |
|---|---|---|
| EP | 0632360 A1 | 1/1995 |
| EP | 0 895 358 A2 | 2/1999 |
| EP | 0978781 A3 | 2/2000 |
| EP | 0978781 A2 | 2/2000 |

* cited by examiner

Primary Examiner—Vibol Tan
(74) Attorney, Agent, or Firm—Wolf, Greenfield & Sacks, P.C.

(57) ABSTRACT

A dynamic power controller is provided that identifies a clock frequency requirement of a processor and determines a voltage requirement to support the clock frequency requirement. The dynamic power controller transitions the processor to a power state defined by the clock frequency requirement and the voltage requirement. In particular, a voltage level indicated by the voltage requirement is supplied to the processor and the frequency distribution indicated by the frequency requirement is provided to the clocks signals of the processor.

38 Claims, 7 Drawing Sheets

DYNAMIC VOLTAGE CONTROL METHOD AND APPARATUS

This application claims the benefit of U.S. Provisional Application 60/315,655 under 35 U.S.C. §119(e) filed Aug. 29, 2001, entitled "DIGITAL BASEBAND PROCESSOR," by Allen, et al. The entirety of the above provisional application is hereby incorporated by reference.

FIELD OF THE INVENTION

This invention relates to reducing the power consumption in processors and, more particularly, to methods and apparatus for dynamically controlling the voltage level supplied to a processor based on the processing state and/or computational demands of the processor by determining the clock frequency requirement and a corresponding voltage requirement of the processor.

BACKGROUND OF THE INVENTION

Power consumption and management is a design concern for developers of processors, digital devices, computer systems etc. In battery powered devices such as cellular phones, laptop computers, person digital assistants (PDAs), and other portable and handheld devices, power consumption may be a significant contributor to the length of time during which a device may operate before the device must either be recharged and/or connected to an alternate power source. As such, power consumption may significantly impact the utility of these devices.

In some computer systems and/or digital devices, power control may provide a binary power state wherein the first power state corresponds to an idle processor and the second power state corresponds to an active processor. However, the processor in a digital device, for example, may have a variety of active processing states with computational demands that require varying levels of power to support the processing state.

However, conventional power control methods may not consider differing power demands of the processor. As such, depending on the computational requirements of the processor, a device may be consuming power in excess of that required to perform the computational tasks and/or functions of the processor.

SUMMARY OF THE INVENTION

One embodiment according to the present invention includes a method of dynamic power control in a system having at least one processor, the at least one processor including at least one clock signal capable of operating at a plurality of frequencies. The method comprises acts of determining a clock frequency requirement of the at least one processor, determining a voltage requirement to support the clock frequency requirement, operating the at least one clock signal according to the clock frequency requirement, and providing a voltage to supply the at least one processor according to the voltage requirement.

Another embodiment according to the present invention includes a processor including at least one clock signal operating at a plurality of frequencies. The processor comprises one or more clocked components receiving the at least one clock signal, and a controller coupled to at least one of the components to determine a clock frequency requirement of the processor, the controller adapted to determine a voltage requirement based on the clock frequency requirement of the processor and to sequence a transition to a power state defined by the clock frequency requirement and the voltage requirement.

Another embodiment according to the present invention includes a controller to dynamically control the power to a processor. The controller comprises a plurality of registers to store information indicating a clock frequency requirement of the processor, a comparator coupled to the plurality of registers, the comparator configured to determine a voltage requirement based on the information stored in the plurality of registers, and a sequencer coupled to the comparator to receive the voltage level signal, the sequencer configured to transition the processor to a power state defined by the clock frequency requirement and the voltage requirement.

Another embodiment according to the present invention includes a low power device comprising at least one processor having a plurality of clocked components operating with a plurality of clock signals, a power supply adapted to provide a variable voltage to the at least one processor, a clock controller adapted to control the frequency of the plurality of clock signals, and a dynamic power controller connected to the power supply and the clock controller, the dynamic power controller adapted to monitor the at least one processor to determine a clock frequency requirement of the at least one processor and to determine a voltage requirement based on the frequency requirement, the dynamic power controller configured to transition the power supply and the clock controller to a power state defined by the clock frequency requirement and the voltage requirement.

DETAILED DESCRIPTION

Figure 1:
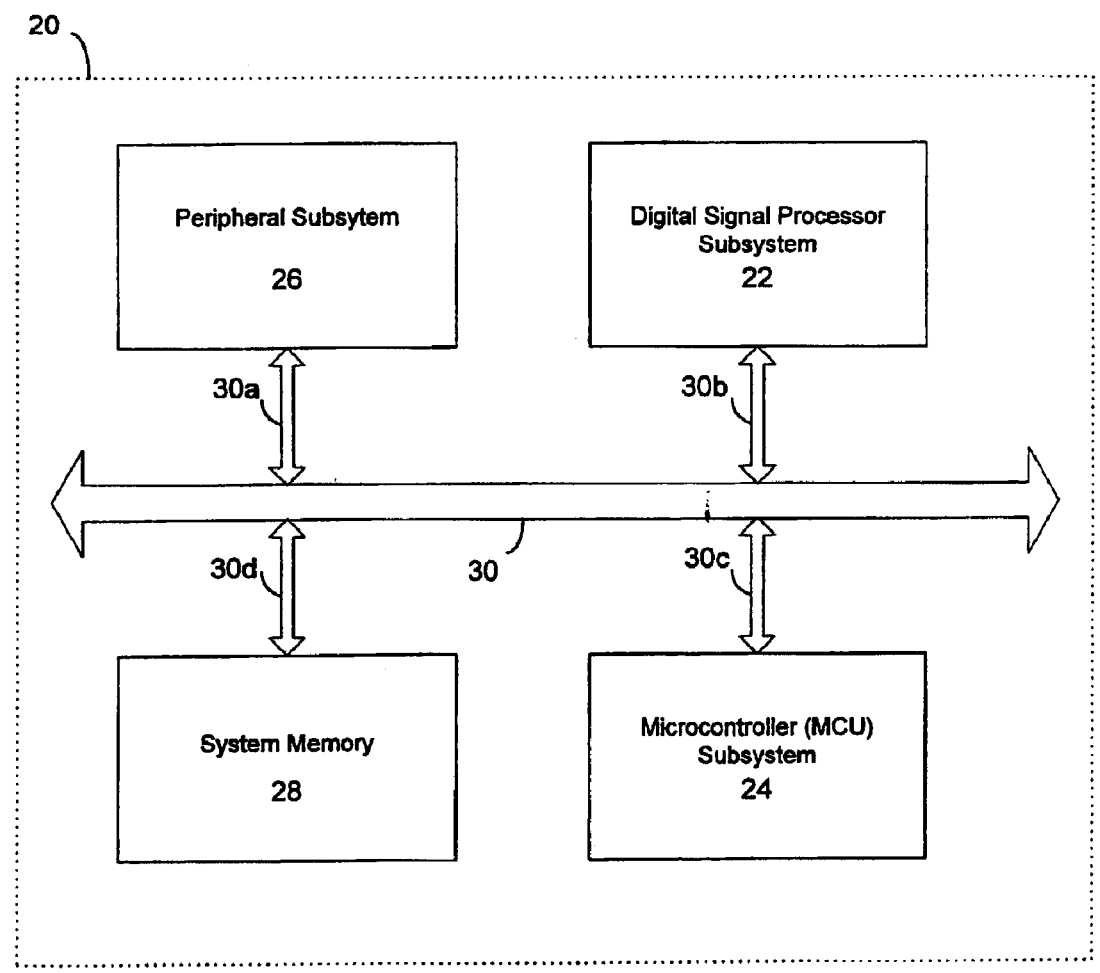
FIG. 1 illustrates a block diagram various subsystems of an exemplary processor.

In many devices, particularly battery powered devices, it is advantageous to reduce the amount of time in which the device's processor is consuming excess power. A processor is considered to be consuming excess power when the computational tasks, functions, and operations of the processor may be performed, and/or the processing demands met, at a lower power state. The term "processor" refers, generally, to any apparatus that performs logic operations, computational tasks, control functions, etc. A processor may include one or more subsystems, components, and/or other processors. A processor will typically include various logic components that operate using a clock signal to latch data, advance and/or sequence logic states, synchronize computations and logic operations, and/or provide other timing functions.

Applicant has observed that the power consumption of a device is related to the square of the voltage supplied to the device's processor and proportional to the frequency at which the processor operates. The power consumption of a device may be expressed as:

$$P_D = cV^2F \quad \text{(Equation 1)}$$

where,
V=the voltage supplied to the device (i.e., the difference between Vdd and Gnd)
F=the frequency (e.g., the clock frequency of a device)
c=a constant determined by the circuits operating at V and F.

In addition, Applicant has recognized that the voltage needed to operate the processor may be a function of the clock frequency or frequencies being provided and distributed to the processor. Accordingly, one way to reduce the power consumption of a device is to dynamically adjust the frequency of the clock signals provided to a processor to reflect the clock frequency requirement of the processor.

The term "clock frequency requirement" refers generally to the clock frequency or set of clock frequencies provided to a processor that are necessary to support the tasks, functions, and/or computational requirements of a processor. Typically, a clock signal or clock signals having a frequency below the clock frequency requirement are not sufficient to operate the logic gates, flips-flops, other clocked circuitry and components to which the clock signal is provided, and are not sufficient to complete tasks in the required amount of time, and/or incapable of performing one or more operations of the processor.

As noted above, the voltage required by the processor may be a function of the clock frequency or set of clock frequencies (i.e., the clock frequency requirement) provided and distributed to the processor. As such, when the computational demands of a processor are low, the processor may have a reduced clock frequency requirement. Therefore, the voltage necessary to support the clock frequency requirement, that is, the voltage requirement, may be reduced accordingly.

The term "voltage requirement" refers, generally, to the voltage level or levels supplied to a processor to support a given clock frequency requirement. In particular, a voltage requirement indicates a voltage value or level sufficient to drive the various clock signals of a processor according to the clock frequency requirement without causing the clocked components to operate erroneously (e.g., memory access failures, timing violations, delays in critical speed paths, etc.). While there may be many voltage levels that will support a clock frequency requirement (e.g. voltages exceeding some minimum voltage), the voltage requirement typically refers to a voltage level that more closely meets the needs of the clock frequency requirement.

As the computational demands on a processor vary with time, there may be opportunities to reduce both the clock signal frequencies and the voltage level applied to the processor (i.e., the processor may be transitioned into a lower power state). Thus, the power consumption of the device can be dynamically adjusted to reflect the processing requirements of the processor. Accordingly, one embodiment according to the present invention includes identifying a clock frequency requirement of a processor and adjusting the voltage supplied to the processor to support the identified clock frequency requirement.

FIG. 1 illustrates a block diagram of an exemplary processor 20. Processor 20 may, for instance, be fabricated on a single semiconductor chip. Processor 20 includes a digital signal processor (DSP) subsystem 22, a microcontroller (MCU) subsystem 24, system memory 28, and peripheral subsystem 26. The various subsystems of the processor are connected to a system bus 30 in order to communicate and/or transfer data between the various components, such as, operands or instructions, addresses and/or control signals, etc.

DSP subsystem 22 may include a high speed digital signal processor. Operation of a digital signal processor is often characterized by real-time performance, computationally intensive and often time critical tasks, frequent memory accesses, etc. The MCU subsystem 24, for instance, may carry out various control functions, coordinate system events, execute system software, etc., and may operate at a lower clock frequency than the DSP. System memory 28 may be an on-chip memory, such as a RAM, providing a memory resource shared by the various subsystems of processor 20. Peripheral subsystem 26 may include the various interfaces and logic required for the processor to communicate with off-chip devices or other processors. For example, peripheral subsystem 26 may communicate with an off-chip power management chip or access an off-chip memory. In addition, the peripheral subsystem may include interfaces to support various communication standards such as serial, Infrared Data Association (IrDA), Universal Serial Bus (USB), SIM interfaces, etc.

The processor depicted in FIG. 1 and similar variants will be used herein to illustrate and demonstrate various aspects of the present invention, however, it should be appreciated that the components and subsystems of the processor here and throughout are merely exemplary. The invention is not limited to or by the number, type, or configuration of the components in a processor implementation. Any device, processor, and/or logic circuitry having a clock frequency requirement that may vary with time is considered to be within the scope of the invention.

As an example, DSP subsystem 22 may also include a variety of components including a scratch memory, a coprocessor, interrupt controller, a dedicated bus, etc. The various components of the DSP subsystem itself may have independent clock frequency requirements. Likewise, the other processor components such as MCU subsystem 24 and peripheral subsystem 26 may contain a variety of clock frequency requirements. As such, the clock frequency requirement of the processor may vary frequently, that is, the active state of the processor may have numerous operating modes.

As such, processor 20 may have a clock frequency requirement that varies with time. For instance, in some operating modes, the DSP may be in an idle state. As such, the high frequency clock signal required by the DSP to perform certain computational tasks may not be necessary in such operating modes. The term "operating mode" characterizes a processing state or set of processing states of the various components of a processor that give rise to a particular clock frequency requirement of the processor. Typically, an operating mode characterizes a processing state of the processor in which it may be possible to transition to a different power state.

In order to provide a processor with the various clock signals that it requires, a single low frequency clock, referred to herein as the system clock, is often provided to the processor as a clock reference. The various clock frequencies required by the processor are then generated from the system clock and distributed appropriately to the subsystems and/or components of the processor. The various clock frequencies required by the processor are often generated from the system clock by a phase locked loop (PLL) multiplier, such that the clock signals distributed to the components of the processor are in-phase with the common reference clock. That is, the clock signals distributed throughout the processor are synchronized.

Figure 2:
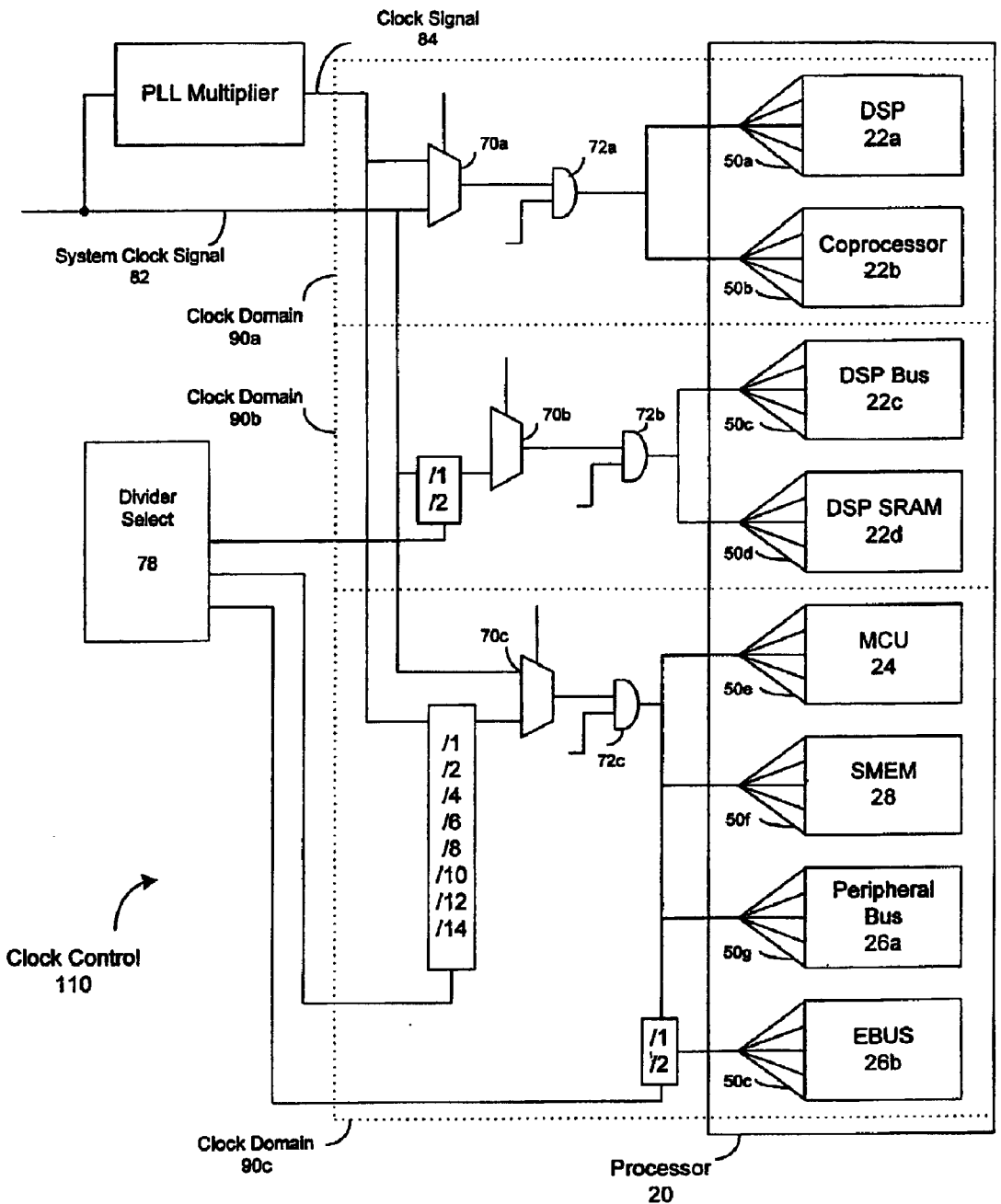
FIG. 2 illustrates a clocking scheme and control to generate and distribute clock signals to the various components of the processor illustrated in FIG. 1.

FIG. 2 illustrates an exemplary system clocking scheme, for example, that distributes the clock signals at the required frequencies to the various components of processor 20. An exemplary set of components that may be part of processor 20 are illustrated in FIG. 2, including DSP 22a, coprocessor 22b, DSP bus 22c (e.g., a dedicated bus that interconnects the DSP subsystem 22), DSP SRAM 22d (e.g., a cache, scratch memory, etc.), MCU 24a, system memory (SMEM) 28, peripheral bus 26a, and external bus (EBUS) 26b. The term clock domain refers generally to a clock signal and a set of frequencies at which the clock signal normally operates. Typically, components operating in a clock domain will have one or more clocked elements (e.g., logic gates, flip-flops, etc.) that operate at the set of frequencies of the respective clock domain. A component may operate in more than one clock domain and, conversely, a clock domain may service more than one component.

The various clock signals and clock signal frequencies required by processor 20 are provided and distributed by the components of clock control 110. In particular, clock control 110 includes a system clock signal 82 and system PLL multiplier 114. System clock signal 82, or simply the system clock, is provided as a reference to synchronize the various other clock signals distributed to the processor. System PLL multiplier 114 receives the system clock signal 82 and provides a high frequency clock signal 84 and locks it in-phase with the system clock signal. Typically, clock signal 84 is some multiple of the system clock.

FIG. 2 illustrates three major clock domains generated from system clock signal 82 and the PLL clock signal 84; clock domain 90a, clock domain 90b, and clock domain 90c. The components of processor 20 operate within these clock domains. For example, DSP 22a and coprocessor 22b may operate in clock domain 90a. DSP bus 22c, and DSP SRAM may operate within clock domain 90b. MCU 24a, SMEM 28, peripheral bus 26a, and external bus (EBUS) 26b, may operate within clock domain 90c.

The clock signals in each clock domain are provided by the various select, divider, and gating logic and distributed to the components of the processor via a plurality of clock trees 50a–50h. For example, clock control 110 includes multiplexers in each of clock domains (e.g., multiplexers 70a, 70b, and 70c, respectively) which may independently select whether clock signal 84 is required in order to operate the components in the corresponding clock domain. Otherwise, clock signal 84 may be bypassed and the system clock signal 82 may be provided to the appropriate components of the processor.

Additionally, clock control 110 may divide the frequency of clock signal 84 in order to provide the components of the processor with clocks signals having reduced frequencies in order to meet the clock frequency requirement of the processor. In particular, dividers 62 and 64 allow the frequency of clock signal 84 to be reduced in frequency. For example, divider 62 may provide the clocked components operating in clock domain 90b with a clock signal having half the frequency of clock signal 84 when the clock signal from the system PLL multiplier is selected. Similarly, divider 64 may provide the clocked components operating in clock domain 90c with a clock signal having a frequency reduced by factors of 2, 4, 6, 8, 10, 12, and 14. Dividers 62 and 64 may be, for instance, divide-by-n counters or equivalent components for reducing the frequency of a clock signal. The various divider factors selected for each clock domain may be selected, for example, by divider select 66.

In the clocking scheme illustrated in FIG. 2, there are multiple stages where power is being consumed. System PLL multiplier 114, for example, may include a voltage controlled oscillator (VCO) in order to generate clock signal 84. As is known in the art, a voltage controlled oscillator provides a voltage to an oscillator to produce a signal having a frequency proportional to the provided voltage. As such, the power consumed in generating clock signal 84 is proportional to the frequency being generated.

In addition, in order to provide clock signals to the various clocked circuits, logic gates, flip-flops, etc. of the processor, clock distribution trees, or simply clock trees, are provided within the components and/or subsystems of the processor. For example, clock tree 50a drives the clock signal of clock domain 90a and distributes it to the low level components of DSP 22a. Similarly, clock tree 50e drives the clock signal of clock domain 90c and distributes it to the low level logic components of MCU 24a. Power is required to charge the various clock trees, thus, power may be conserved if the clock trees may be disabled when the associated components are in an idle state. Moreover, further clock gating logic may be included within the clock trees in order to control power consumption at a finer granularity, that is, to gate off certain portions of the clock tree distribution network.

As such, by recognizing the clock frequency requirement of the processor, clock control 100 may configure the frequency distribution to reduce the intervals when excess clock frequencies are being generated. In addition, clock control 110 may control the disabling of various clock trees or portions of clock trees according to the clock frequency requirement of the processor.

It should be appreciated that the clocking scheme illustrated in FIG. 2 is merely exemplary and is meant to illustrate one scheme by which the various clock signals required by a processor may be controlled and distributed to the components and/or subsystems of the processor. However, various system clocking schemes will occur to those skilled in the art to satisfy a particular set of clocking requirements. For instance, the system clock is shown as being multiplexed with the clock signal provided by the PLL multiplier. However, the system clock may be considered and distributed as a separate clock domain independent of the PLL clock signal. The particular design choice for a system clocking scheme is not limiting and the various alternatives, modifications, and improvements are considered to be within the scope of the invention.

Figure 3:
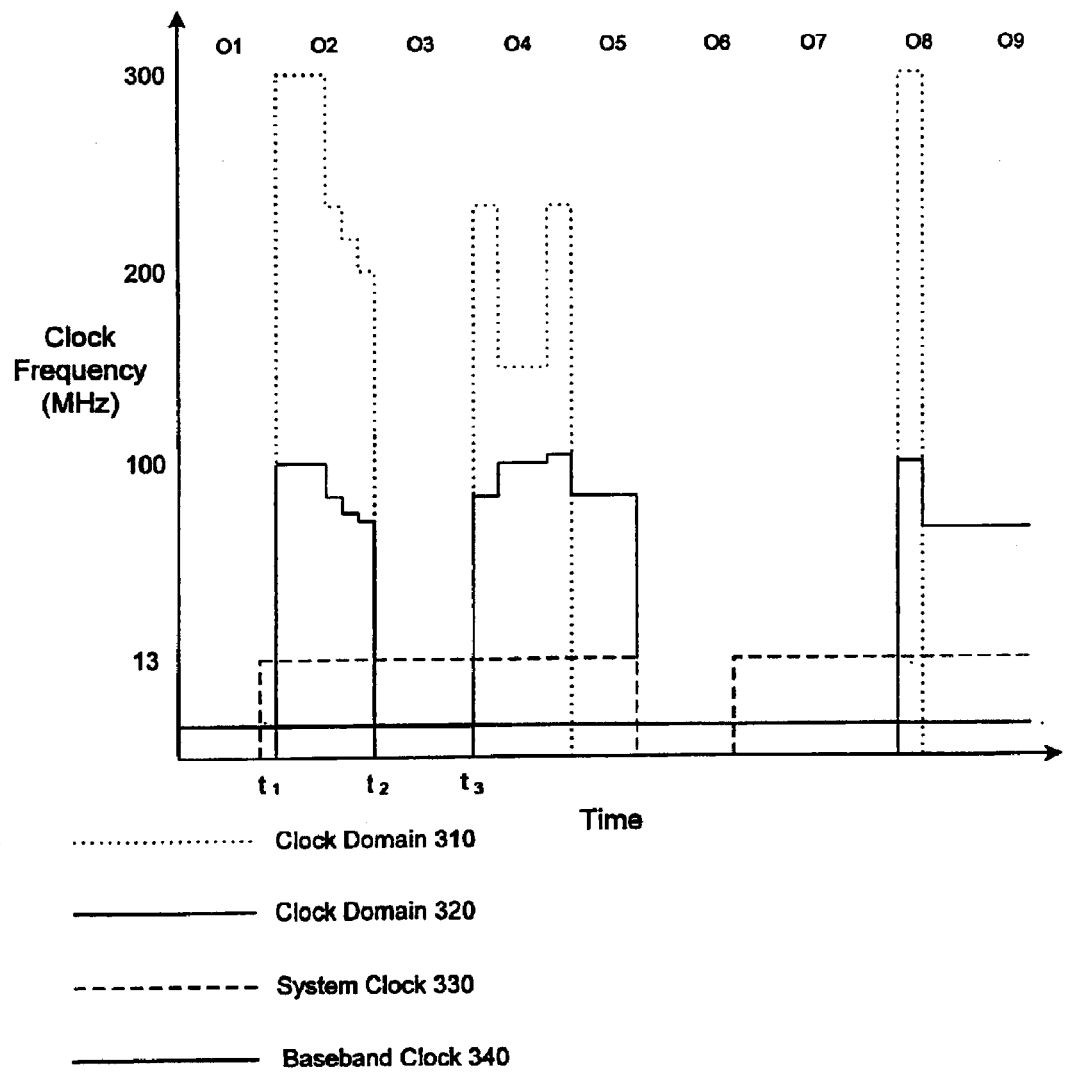
FIG. 3 illustrates a diagram of how exemplary clock signals of a processor may vary as a function of time in different operating modes.

FIG. 3 is a diagram illustrating how the various clock frequencies distributed to a processor might vary over time. Plot 300 shows exemplary frequency values of four clock domains of a system clocking scheme of a baseband processor as they might vary in time. The baseband processor producing the exemplary clock frequency requirement function illustrated in FIG. 3 may be similar to processor 20 illustrated in FIG. 1. Clock domain 310, denoted by the dotted line, and clock domain 320, denoted by the regular solid line, may be similar to clock domains 90a and 90c of FIG. 2, respectively. Clock domain 330, denoted by the dashed line, may be, for instance, a system clock domain. In addition, the baseband processor includes baseband clock domain 340, denoted by the bold line, to provide the baseband clock to the appropriate components of the processor. Often processors used in wireless communication will be synchronized to external and often remote devices operate via a low frequency baseband clock.

Labeled across the top of plot 300, are a series of operating modes indicated as O1–O9. It should be appreciated that the operating modes may be demarcated in any number of ways and will depend upon the design of a processor and the level of desired granularity. For instance, each change in frequency in one of the clock domains may be considered a different operating mode.

In operating mode O1, the only enabled clock is the baseband clock 330. All other clocks may be disabled. For instance, if the baseband processor is used in a cellular phone, for example, operation mode 1 may occur when the cellular phone is on but not being used (i.e., in a standby mode). At some time $t_1$, an event occurs requiring the processing power of, for example, the DSP. As such, the system clock 330 is enabled, supplied to the PLL which generates the maximum clock rate. The event triggering a transition into the second operating mode may require processing from components in clock domains 310, and 320. As such, all the clock trees may be enabled. Over time, the performance demands may decrease and the clock frequencies may be stepped down (e.g., the frequency of the clock signal generated from a system PLL multiplier may be reduced).

At a time $t_2$ the task or tasks requiring clock domains 310 and 320 may be completed and the computational demands of the processor reduced. As such, the system PLL multiplier may be bypassed, leaving only the system clock and the baseband clock enabled. At a time $t_3$, another event may occur wherein the processing requirements yield a configuration of active clock domains illustrated in operating mode O4. Similarly, operating modes O5–O9 illustrate further processing states that may give rise to the corresponding clock requirements illustrated in FIG. 2.

Accordingly, as the computational demands vary with time, the reduced processing requirements may provide opportunities where the clock signal frequencies may be reduced. Moreover, certain clock domains may be unnecessary during certain operating modes such that the associated clock trees may be disabled. In response to the changing clock frequency requirement, the voltage supplied to the processor may be adjusted to support the changing needs of the clock frequency requirement. As such, reduced clock frequency requirements may have reduced voltage requirements.

Applicants have identified and appreciated that by monitoring the clock frequency requirement of a processor, the voltage supplied to the processor can be dynamically controlled such that the processor spends less time supplying a voltage to the processor in excess of the requirement.

Figure 4:
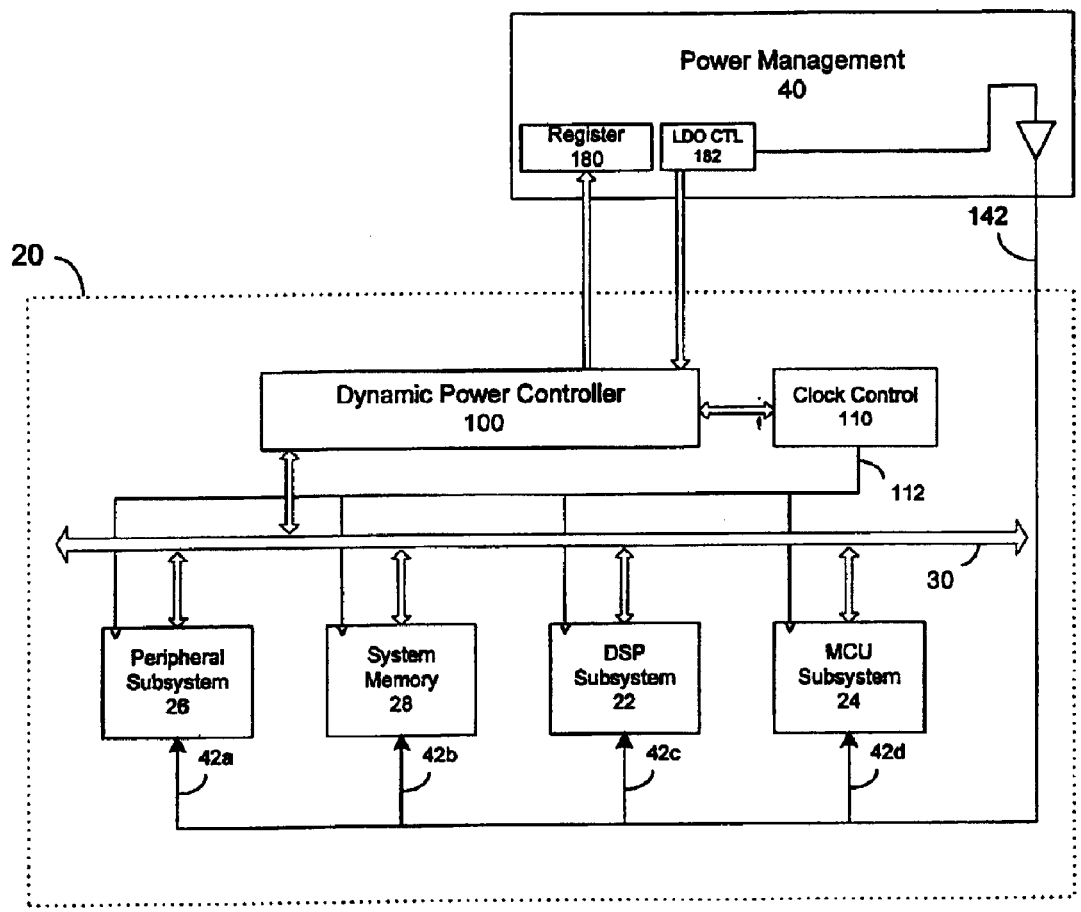
FIG. 4 illustrates a processor having dynamic power control capabilities according to one embodiment the present invention.

FIG. 4 illustrates one embodiment according to the present invention including a processor 20' having dynamic power control (DPC) capabilities. For purposes of illustration, processor 20' includes the subsystems as shown and described in connection with FIG. 1.

During operation of processor 20', the computational demands on the subsystems may vary with time. As such, the clock frequency requirement of the processor may also change as the various components and subsystems transition into different processing states. Dynamic power control (DPC) 100 may be connected to system bus 30 in order to communicate with the various subsystems of processor 20'. Dynamic power controller 100 may, alternatively, communicate with the subsystems in various other ways, such as shared registers having appropriate interconnections, etc.

In FIG. 4, processor 20' is supplied power by off-chip power management 40. Although, power management 40 is illustrated as residing off-chip, it may alternatively be located on the same semiconductor chip as the processor. Power management 40 may be any component capable of providing a source of power, typically, by providing a voltage level that may be specified by the component receiving power. For example, power management 40 may include a read/write register that may be accessed and written to in order to request a particular voltage level.

DPC 100 is connected to register 180 in order to indicate to power management the voltage level to be supplied to the processor. Power management may be, for instance, a low dropout (LDO) voltage regulator. Power management may include LDO control 182 to indicate when the voltage level specified in register 180 is stable and may be provided on supply line 142.

In addition, DPC 100 is connected to clock control 110. Processor 20' may, for example, have a system clocking scheme substantially the same as that illustrated in FIG. 2. As such, clock control 110 may include various components and logic gates to distribute clock signals to the various subsystems of the processor. For example, clock control 110 may include a system PLL multiplier, bypass multiplexers, divider selects, disable logic, clock trees, etc., as illustrated in FIG. 2.

Clock control 110 may include a writeable register coupled to the system PLL multiplier to store the frequency to be output by the system PLL multiplier. This register, may alternatively, store a voltage value required of the VCO to produce the desired frequency, a multiplier ratio of the input clock signal required to provide the desired frequency, or some other value indicative of the desired frequency of the high frequency output clock signal produced by the system PLL multiplier. In addition, clock control may include registers or other control means by which the desired divider factors of the dividers in the various clock domains may be controlled. For instance, divider select may include a bank of registers with which to store the desired divider factors. In addition, clock control 110 may include logic that allows the various clock domains to be gated off, the clock trees independently disabled, and/or portions of the clock trees disabled.

DPC 100 monitors processor 20' to determine the processing states of the components and/or subsystems in order to determine a current clock frequency requirement of the processor. In response to the clock frequency requirement, DPC 100 determines a voltage level required to support the clock frequency requirement. DPC 100 then instructs power management 40 to adjust the voltage supplied to the processor and instructs clock control 110 to provide the frequency distribution accorded by the clock frequency requirement of the processor to the various subsystems and components.

It should be appreciated that a controller (e.g., dynamic power controller 100) may be implemented in numerous ways, such as with dedicated hardware (e.g., various circuitry, preprogrammed logic arrays, finite state machines (FSMs), etc.), or using one or more processors that are programmed using software (e.g., microcode) to perform the various functions of the controller. It also should be appreciated that implementations of a controller according to various embodiments of the present invention may include hardware, firmware, and software oriented elements.

Figure 5:
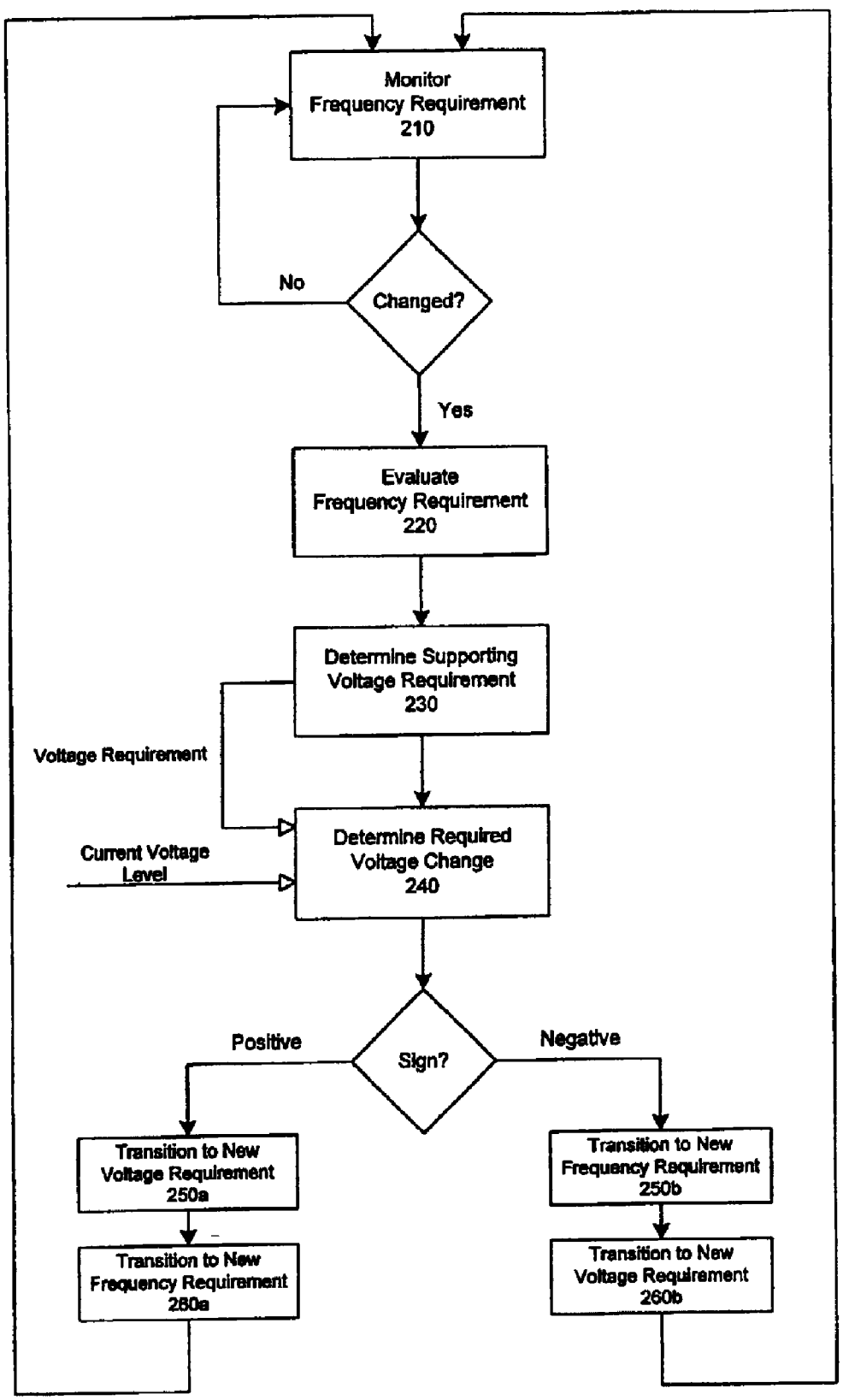
FIG. 5 illustrates a method of providing dynamic power control to a processor according to one embodiment of the present invention.

FIG. 5 illustrates a flow chart depicting one method of dynamically adjusting the power supplied to a processor according to the present invention. For instance, the method described below may be used by DPC 100 in order dynamically control the voltage supply to processor 20'.

In step 210, a DPC monitors the clock frequency requirement of the processor. A change in the clock frequency requirement may indicate that the voltage level supplied to the processor may be reduced or it may indicate that the processing demands of the processor now require additional voltage in order to support the new clock frequency requirement. As such, in step 220, the clock frequency requirement is evaluated in order to determine a voltage requirement necessary to support the new clock frequency requirement.

For example, the clock frequency requirement may represent the minimum frequency that each clock domain requires in order to perform the functions and/or computational tasks of the components operating in that clock domain. As such, the DPC may select the maximum value, referred to as the maximum-minimum frequency value, in order to determine the voltage requirement of the system.

Other methods of determining a voltage requirement from a clock frequency requirement of the processor will occur to those skilled in the art and may depend on the clocking scheme of a particular processor implementation. For instance, the DPC may consider which clock trees may be disabled under the new clock frequency requirement when determining the voltage requirement. The DPC may also consider more than the maximum minimum value of the clock frequency requirement when determining the voltage. The various methods for determining a voltage requirement from a given clock frequency requirement are considered to be within the scope of the present invention.

In step 230, a voltage level sufficient to support the clock frequency requirement is determined. In step 240, the current voltage level being supplied to the processor is compared to the voltage requirement determined in step 240 to determine the required voltage change, or delta, required to provide the voltage requirement.

If the sign of the voltage change is positive (i.e., the voltage requirement is greater than the current voltage level), then the sequence of events to transition to the higher power state follows that indicated in step 250*a* and 260*a*. As such, the voltage level indicated by the voltage requirement is first transitioned. For example, the DPC may request that power management increase the supply voltage to meet the voltage requirement of the processor. After the new voltage level has been fully transitioned (i.e., the new supply voltage is stable), the new frequency distribution as indicated by the clock frequency requirement may be applied to the various subsystems of the processor. For example, the DPC may instruct clock control to distribute clock signals according to the clock frequency requirement to the processor.

If the sign of the voltage change is negative (i.e., the voltage requirement is less than the voltage level), then the sequence of events to transition to the lower power state follows that indicated in step 250*b* and 260*b*. As such, the frequency distribution indicated by the clock frequency requirement is first provided to the subsystems and components of the processor. When the processor is operating according the new clock frequency requirement, the voltage supplied to the processor is reduced to the voltage level indicated by the voltage requirement determined in step 230.

The voltage and frequency transitions may be sequenced in the order described above to avoid erroneous operation of the processor. For example, consider the clock frequency requirement for accessing memory. As the frequency increases for a fixed voltage, there may be a point at which memory access fails. As such, to avoid such potential problems during power state transitions, when going to a higher power state, the voltage may be stepped up before the clock frequency is increased. When going to a lower power state, frequency may be first decreased before reducing the voltage supplied to the processor.

Figure 6:
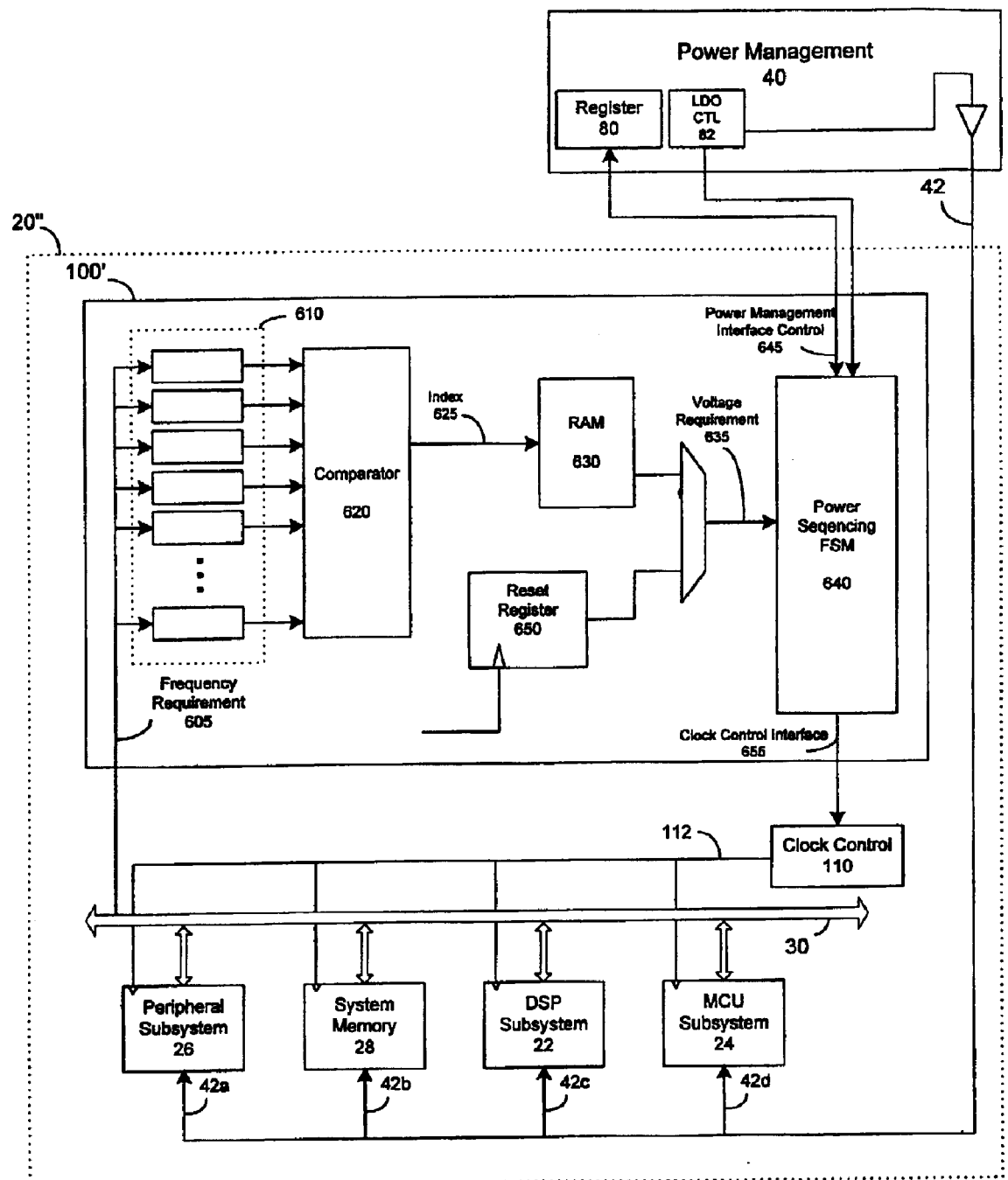
FIG. 6 illustrates one embodiment of a dynamic power controller according to the present invention.

The method described in connection with FIG. 5 may be realized in a number of ways and by various designs and implementations. FIG. 6 illustrates one embodiment of a DPC according to the present invention. The schematic illustrates a hardware solution to dynamic power control. DPC 100' includes a bank of registers 610, a comparator 620, random access memory (RAM) 630, and power sequencing finite state machine (FSM) 640, and reset register 650. DPC 100' is illustrated as controlling the subsystems of processor 20", which, for clarity, include those subsystems, components, and clocking scheme previously described. Power is supplied to the processor by power management 40.

Registers 610 store information indicating the clock frequency requirement of processor 20". For instance, registers 610 may store frequency values required for each clock domain. In addition, there may be a register associated with each subsystem operating in a clock domain to indicate the clock frequency required by each subsystem from each of the clock domains. The particular number, arrangement and association of the registers is a matter of design choice and any variation that adequately indicates the processor frequency requirement is considered to be within the scope of the invention.

Comparator 620 compares the frequency values stored in the registers in registers 610 in order to determine a voltage required to support the distribution of clock frequencies as indicated in the register bank. One method of determining the voltage requirement is to choose the largest frequency from the register bank (i.e., the comparator selects the maximum minimum value from the clock frequency requirement of the processor) to determine the voltage requirement. This frequency value, for example, may indicate the frequency required of the clock signal provided by the system PLL multiplier. The voltage requirement may then be based, at least in part, on the voltage level that the signal generator (e.g., a voltage controlled oscillator) of the system PLL multiplier needs to generate the indicated frequency.

RAM 630 may, for example, store a lookup table containing voltage values required to support various clock frequency requirements of the processor. As such, comparator 620 may map the selected frequency value or otherwise map the frequency requirement indicated in registers 610 to a location in RAM 630. The voltage level obtained from RAM 630 corresponds to the voltage requirement associated with the processor frequency requirement.

It should be appreciated that various methods of encoding the clock frequency requirement to determine a voltage level that will support the processor operating at a particular clock frequency requirement will occur to those skilled in the art. The design of the processor, clocking scheme, and other processor requirement and considerations may guide the particular mapping scheme from clock frequency requirement to voltage requirement. However, these variations do not depart from the scope of the invention.

The voltage value obtained from RAM 630 is then provided to the power sequencing finite state machine (FSM). The power sequencing FSM then transitions the processor to the power state indicated by the clock frequency and voltage requirements. For example, the power sequencing FSM may check the current voltage level being supplied to the processor by reading the voltage value stored in register 180 in order to determine the sign of the voltage change required to meet the voltage requirement of the processor (e.g., the voltage level obtained from RAM 630).

If the sign of the voltage change is positive, the power sequencing FSM may first instruct power management 40 to supply the desired voltage level (i.e., DPC 100' may write the desired voltage level into register 180). After power management 40 has indicated that the voltage level has been transitioned and is stable (i.e., power management 40 may indicate that the voltage is stable via line 184), the power sequencing FSM may then instruct clock control 110 to increase the frequency of the various clock domains in order to meet the clock frequency requirement of the processor.

For example, power sequencing FSM may instruct clock control 110 to increase the frequency of the clock signal output from the system PLL multiplier. Alternatively, power sequencing FSM may have access to a register that indicates to the system PLL mulitplier what clock frequency should be output.

If the sign of the voltage change is negative, the power sequencing FSM may first instruct clock control 110 to reduce the clock frequency of the various clock domains to reflect the clock frequency requirement of the processor. Once the frequencies have been reduced, the power sequencing FSM may instruct the power management to modify the voltage supplied to the processor according to the voltage level obtained from RAM. As such, the power sequencing FSM insures that power state transitions are sequenced in an order that avoids potential operation errors of the processor.

Reset register 650 provides power sequencing FSM 640 with valid voltage levels during startup/reset. Since the information stored in RAM 630 may not be dependable during startup/reset, reset register 650 insures that a voltage sufficient to support the tasks involved in reset/startup, various boot events, etc., will be provided to the processor. As such, the value or values stored in reset register 650 might only be selected during startup/reset.

Each time that one of the values in the register bank changes, the comparator may re-evaluate the clock frequency requirement of the processor in order to determine whether or not the voltage level can or should be changed in order to accommodate the new clock frequency requirement (e.g., comparator 620 decides if the processor can transition to a new power state). The bank of registers 610 may be written to, for example, by software that runs on the processor (e.g., the DSP or the MCU). As an example, referring to processor 20", consider an operating mode in which the DSP is processing a high priority task that requires a 300 MHz frequency clock. The MCU is concurrently processing a task requiring a 60 MHz frequency clock.

As such, software running on the DSP and/or MCU may write the frequency required by the various clocks domains into the associated register in register bank 610 (e.g., the register associated with clock domain 310 may store a frequency value of 300 MHz and the register associated with clock domain 320 may store a value of 60 MHz).

The comparator 620 may implement a maximum minimum selection method. Accordingly, the comparator would select the 300 MHz frequency value as a basis for determining the voltage requirement of the processor. An index into RAM 630 may be derived from the maximum minimum value, for instance, a value of 300 MHz may map to a location in memory storing a voltage value of 1.5 volts. As such, the power management may be supplying the processor with 1.5 volts in order to support the current clock frequency requirement of the processor.

At some point in time, the processor may complete its high priority task, and the computational demands of the processor may be reduced. For instance, the DSP may require only a 180 MHz clock in order to meet the processing demands of the current computation. Software running on the DSP, for instance, may identify this reduced clock frequency requirement of the DSP and write the new frequency value into the appropriate register. DPC 100" then detects a change in one of the values stored in the register bank. Accordingly, comparator 620 may reevaluate the processor's clock frequency requirement and determine that the new maximum-minimum frequency value is 180 MHz. This new value may map, for instance, to a value of 1.2 volts in RAM 630.

Power sequencing FSM receives this new voltage value and determines that a negative voltage transition is required to reflect the voltage requirement needed to support the new clock frequency requirement of the processor. As such, the power sequencing FSM may instruct the multiplier select value of the system PLL multiplier to be reduced in order to supply a 180 MHz clock signal. After the reduced frequency is provided by the PLL, the power sequencing FSM may write a value of 1.2 volts into register 180. Power management 40 then reads this value and supplies the new reduced voltage level to the processor. As such, the processor will operate in a reduced power state reflecting clock frequency requirement of the processor.

The comparator need not determine the index into the lookup table based on the maximum-minimum value. For instance, the comparator may consider the various clock frequencies stored in the register bank in a variety of ways. For example, the 180 MHz clock frequency of clock domain 310, may be able to be supported by a lower voltage, for instance, 0.09 volts. However, it may be the case that 0.9 volts isn't sufficient to support the processor clock frequency requirement because of the requirements of the other clock domains (e.g., 75 MHz for clock domain 320 and a 26 MHz system clock distribution). The comparator may be configured to recognize that the clock frequency requirement cannot be supported by 0.9 volts, and as such, and the clock frequency requirement described above may map to a voltage requirement of 1.2 volts, even though the maximum minimum value could itself be supported by a lower voltage.

At some later instant, the MCU may finish its task and require only a 45 MHz clock in order to meet the computational demands of the current processing state. Software running on the MCU, for instance, may identify the new processing state and write the new frequency value into the appropriate register.

In response to a change in a register value, the comparator may determine that the clock frequency requirement of the processor has been modified, even though the maximum-minimum value remains the same (e.g., 180 MHz). For instance, the new clock frequency requirement may map to a voltage level of 0.9 volts. The power sequencing FSM may then transition to the reduced power state according to the sequence described above. However, the change in frequency required by the MCU (e.g., 45 MHz) may be generated by adjusting the divider factor of the appropriate clock domain. As such, the multiplier select value of the PLL may not be reduced in some power state transistions.

At some later instant, the DSP may need to process another high priority task. As such, software may identify the new clock frequency requirement of the DSP, for instance, 240 MHz and write this value into the appropriate register. The comparator may then reevaluate the clock frequency requirement of the processor and determine that a new voltage requirement is necessary to support the current clock frequency requirement of the processor. The comparator then indexes into memory and a corresponding voltage value, for instance, 1.5 volts is issued to the power sequencing FSM. The power sequencing FSM determines that a positive change in the voltage level is required to meet the new voltage requirement.

As such, the FSM may first write the new voltage value into register 180 in order to transition the voltage supplied to the processor. After power management 40 has read the value and indicated that the voltage has been transitioned and stabilized, the FSM begins sequencing clock control in order to provide the higher clock frequency requirement (e.g., power sequencing FSM may modify or instruct clock control to modify the multiplier select value to increase the frequency of the clock signal generated by the system PLL multiplier).

There may be other factors and/or processing conditions that influence a voltage level required to support a particular clock frequency requirement. For example, the number of clock trees that may be disabled entirely may influence the voltage requirement. As such, DPC 100" may consider more than just frequency values. For example, a DPC may consider which clock domains or which clock trees within a clock domain may be disabled during a given operating mode.

Figure 7:
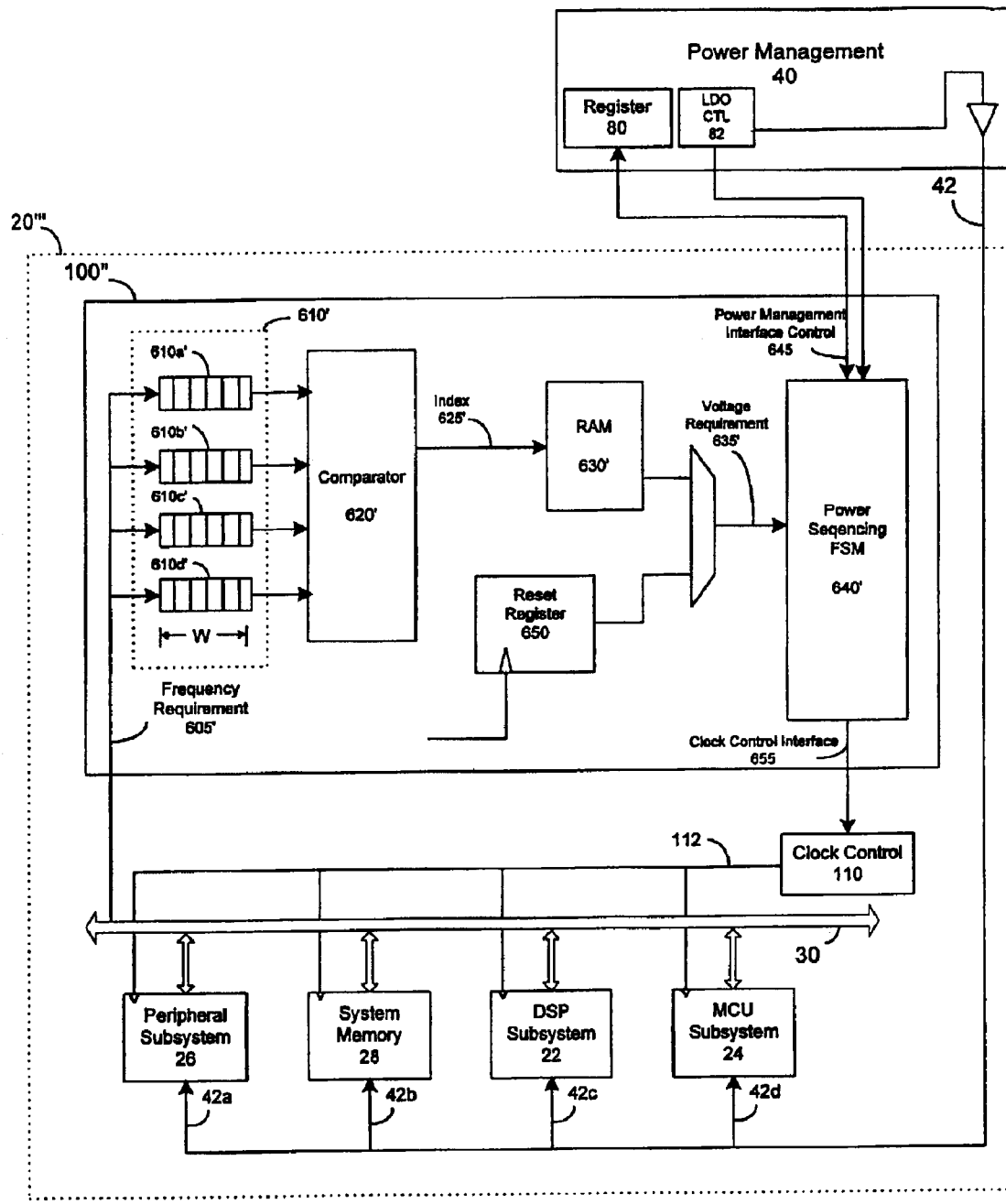
FIG. 7 illustrates another embodiment of a dynamic power controller according to the present invention.

FIG. 7 illustrates another embodiment according to the present invention. Registers 610' store information indicating the frequency requirement of the processor. Registers 610' may, for example, include a register for each of the main subsystems of the processor. Each register may store a binary indication as to whether the associated subsystem requires a particular clock signal, or the clock signal of a particular clock domain.
As such, the width W of the registers 610' be related to the number of clock signals provided and distributed to the processor.

For example, assume that register 610a' corresponds to the frequency requirement of the DSP subsystem. According to the computational demands of the subsystem, the DSP may indicate which clock signals it requires in order to meet the current processing demands. The DSP may, for instance, before transitioning to an idle state, indicate such a clock frequency requirement by writing a zero into each bit of register 610a'. Alternatively, if the DSP still requires a system clock signal, for instance, even when in an idle state, the DSP may indicate a 1 in the bit corresponding to the system clock. The other subsystems of the processor would similarly indicate which clock signals are required in order to perform the functions and/or computational tasks of a particular operating mode.

As such, comparator 620' may map the binary clock indications to a location in memory storing a voltage level to support the clock signal configuration indicated by the frequency requirement stored in registers 610'. In one embodiment, each clock domain may have an associated frequency with which it operates when a subsystem indicates that it is required. For example, the maximum clock rate may be considered when the DSP subsystem indicates that it requires the clock signal, for example, in clock domain 310 illustrated in FIG. 3.

In one aspect of this embodiment, comparator 620' includes software that considers the clock signal configuration indicated by registers 610' and determines the clock frequencies that are required. For instance, if both the MCU subsystem and the DSP subsystem require the clock signal in domain 310, the software may recognize that the frequency requirement is guided by the DSP. If the MCU indicates that the clock signal in clock domain 310 is required, but the DSP indicates that it is not required, the software may determine that the frequency of the clock signal may be reduced due to the fact that the MCU will guide the requirement. The frequency requirement determined by software may then be mapped into a location in memory storing a voltage level capable of supporting the clock frequency requirement.

Alternatively, registers 610a' may include a pair of registers for each subsystem. The first register may include a bit for each clock signal in the processor that indicates whether the subsystem requires the clock signal when in an active state. The second register may include a bit for each clock signal in the processor that indicates whether the subsystem requires the clock signal when in an idle state.

In some embodiments, RAM 630 may be replaced with a programmable logic array PLA. For example, a comparator may map information provided about the clock frequency requirement of the processor (e.g., as stored in a register bank, memory, etc.) to an encoded input. The programmable logic array may be programmed to provide an output from the encoded input indicative of a voltage level required to support the clock frequency requirement. The encoding from clock frequency requirement to an input to the PLA, as noted in the foregoing, may depend on the various design considerations of the processor.

One method of achieving a higher level of granularity in power control involves including a clock frequency requirement of a particular task, process, and/or set of related tasks in the profile of the task. For instance, when a particular task or job is to be processed, a process scheduler, for instance, may extract the frequency requirement from the task profile and update the registers of a DPC. This update may invoke a power transition of the processor. As such, a processor may operate in a power state reflecting the demands of the processor at the task or process level.

Other modifications, variations and improvements in providing power control to a processor to reduce the time the processor operates with excess power will occur to those skilled in the art and are considered to be within the scope of the invention.

Having described several embodiments of the invention in detail, various modifications and improvements will readily occur to those skilled in the art. Such modifications and improvements are intended to be within the scope of the invention. Accordingly, the foregoing description is by way of example only, and is not intended as limiting. The invention is limited only as defined by the following claims and the equivalents thereto.

What is claimed is:

1. In a system including at least one processor having at least one clock signal capable of operating at a plurality of frequencies, a method of dynamic power control comprising acts of:

determining a clock frequency requirement of the at least one processor;

determining a voltage requirement to support the clock frequency requirement;

operating the at least one clock signal according to the clock frequency requirement; and providing a voltage to supply the at least one processor according to the voltage requirement;

wherein the act of determining the voltage requirement includes an act of determining a maximum minimum clock frequency of the clock frequency requirement.

2. The method of claim 1, further comprising an act of determining a sign of a voltage difference between a current voltage supplied to the at least one processor and a voltage according to the voltage requirement.

3. The method of claim 2, wherein the act of providing the voltage to supply the at least one processor according to the voltage requirement is enacted before the act of operating the at least one clock signal according to the clock frequency requirement when the sign of the voltage difference is positive.

4. The method of claim 2, wherein the act of operating the at least one clock signal according to the clock frequency requirement is enacted before the act of providing the voltage to supply the at least one processor according to the voltage requirement when the sign of the voltage difference is negative.

5. The method of claim 1, wherein the at least one processor has a plurality of clock domains, each clock domain providing a clock signal at a plurality of frequencies to a plurality of components of the at least one processor; and wherein the act of determining the clock frequency requirement includes determining the minimum clock frequency required in each of the plurality of clock domains.

6. The method of claim 5, further comprising an act of comparing the minimum clock frequency required in each of the plurality of clock domains.

7. The method of claim 6, wherein the act of comparing includes comparing the minimum clock frequency required in each of the plurality of clock domains to determine a maximum minimum clock frequency required by the plurality of clock domains.

8. The method of claim 7, wherein the act of determining the voltage requirement includes determining the voltage requirement from the maximum minimum clock frequency.

9. The method of claim 1, wherein the at least one processor has a plurality of clock domains, each clock domain providing a clock signal to a plurality of components of the processor, each clock signal having at least one associated frequency; and wherein determining the clock frequency requirement includes determining whether each of the plurality of clock domains is required to be enabled.

10. The method of claim 9, wherein the act of determining the voltage requirement includes an act of determining the voltage requirement based on the at least one associated frequency of the clock domains that are required to be enabled.

11. A processor including at least one clock signal operating at a plurality of frequencies, the processor comprising:

one or more components receiving the at least one clock signal; and a controller coupled to at least one of the components to identify a clock frequency requirement of the processor, the controller adapted to determine a voltage requirement based on the clock frequency requirement of the processor and to sequence a transition to a power state defined by the clock frequency requirement and the voltage requirement;

wherein the controller is coupled to at least one component by a plurality of registers, the plurality of registers storing information indicating the clock frequency requirement of the processor.

12. The processor of claim 11, wherein the controller further comprises a comparator coupled to the plurality of registers, the comparator configured to determine the voltage requirement based on the information stored in the plurality of registers.

13. The processor of claim 12, wherein the processor includes a plurality of clock signals, operating at a plurality of frequencies, and provided to the one or more clocked components.

14. The processor of claim 13, wherein the plurality of registers store values corresponding to the clock frequency requirement of each of the plurality of clock signals.

15. The processor of claim 14, wherein the comparator determines the maximum value stored in the plurality of registers to determined the clock frequency requirement.

16. The processor of claim 12, wherein the controller further comprises a memory to a plurality of voltage values.

17. The processor of claim 16, wherein the comparator maps the information stored in the plurality of registers to a location in memory storing a voltage value sufficient to support the clock frequency requirement of the processor.

18. The processor of claim 17, wherein the controller includes a finite state machine to sequence a transition to the power state defined by the clock frequency requirement and voltage requirement.

19. The processor of claim 18, wherein the finite state machine receives the voltage value obtained from the memory and determines a sign of a difference between a current voltage level being supplied to the processor and the obtained voltage value.

20. The processor of claim 19, wherein the finite state machine transitions the processor to operate with the obtained voltage value and then transitions the processor to operate with the clock frequency requirement when the sign of the difference is positive.

21. The processor of claim 19, wherein the finite state machine transitions the processor to operate with the clock frequency requirement and then transitions the processor to operate with the obtained voltage value when the sign of the difference is negative.

22. The processor of claim 11, wherein the at least one clock signal includes a plurality of clock signals provided to the one or more clocked components includes a plurality of clocked components.

23. The processor of claim 22, wherein the plurality of registers store a frequency value for each of the plurality of clock signals required by each of the plurality of clocked components.

24. The processor of claim 22, wherein the plurality of registers store a binary value to indicate whether each of the plurality of clocked components requires each of the plurality of clock signals.

25. A controller to dynamically control the power to a processor having a plurality of clock signals, the controller comprising:

a plurality of registers to store information indicating a clock frequency requirement of the processor;

a comparator coupled to the plurality of registers, the comparator configured to determine a voltage requirement based on the information stored in the plurality of registers; and a sequencer coupled to the comparator and configured to transition the processor to a power state defined by the clock frequency requirement and the voltage requirement.

26. The controller of claim 25, wherein the plurality of registers store a plurality of frequency values required by a plurality of components of the processor.

27. The controller of claim 25, wherein each of the plurality of registers contain a bit for each of the plurality of clock signals provided to the processor, the bit indicating whether the corresponding clock signal is required to be enabled.

28. The controller of claim 26, wherein the comparator includes a memory to store a plurality of voltage values and wherein the comparator is configured to map the plurality of frequency values stored in the plurality of registers to a location in the memory storing a voltage value sufficient to support the clock frequency requirement indicated by the plurality of frequency values.

29. The controller of claim 26, wherein the comparator includes a programmable logic array, the comparator adapted to map the plurality of frequency values stored in the plurality of registers to an input to the programmable logic array, the programmable logic array programmed to provide an output to the sequencer indicative of a voltage value required to support the clock frequency requirement.

30. The controller of claim 25, wherein the sequencer is a finite state machine.

31. The controller of claim 25, in combination with the processor, the processor further including a plurality of components.

32. The combination of claim 31, wherein each of the plurality of components indicates via a respective one of the plurality of registers a clock frequency requirement of the component.

33. The combination of claim 25, wherein the plurality of registers include a bit corresponding to each of the plurality of clock signals.

34. The combination of claim 33, wherein each of the plurality of components is associated with at least one of the plurality of registers and each of the plurality of components indicate, via the bit corresponding to each of the plurality of clocks signals, whether the respective clock signal is required.

35. A device comprising:

at least one processor having a plurality of components operating with a plurality of clock signals;

a power supply adapted to provide a variable level voltage to the at least one processor;

a clock controller adapted to control a frequency of the plurality of clock signals; and a dynamic power controller, connected to the power supply and the clock controller, adapted to monitor the at least one processor to determine a clock frequency requirement of the at least one processor and to determine a voltage requirement based on the clock frequency requirement, and configured to transition the power supply and the clock controller to a power state defined by the clock frequency requirement and the voltage requirement.

36. The low power device of claim 35, wherein the plurality of clock signals includes a system clock signal.

37. The low power device of claim 36, wherein the clock controller includes a phase locked loop (PLL) frequency multiplier to provide a high frequency clock signal synchronized to the system clock signal.

38. The low power device of claim 37, wherein the plurality of clock signals are derived from the system clock signal and the high frequency clock signal.

* * * * *